POWER TRANSISTOR DEVICE

Filed Dec. 16, 1963 2 Sheets-Sheet 1

Donald R. Baird
INVENTOR
BY John G. Graham
ATTORNEY

POWER TRANSISTOR DEVICE

Filed Dec. 16, 1963 2 Sheets-Sheet 2

Donald R. Baird
INVENTOR

BY
ATTORNEY

United States Patent Office 3,264,399

Patented August 2, 1966

3,264,399

POWER TRANSISTOR DEVICE

Donald R. Baird, Richardson, Tex., assignor to Texas Instruments Incorporated, Dallas, Tex., a corporation of Delaware Filed Dec. 16, 1963, Ser. No. 331,346
2 Claims. (Cl. 174—15)

The present invention relates to semiconductors, and more particularly, but not by way of limitation, relates to an improved encapsulation device for power transistors and similar semiconductor devices.

The standard power transistor devices presently on the market employ a diamond-shaped, flat header plate. A pair of lead wires extend through the header plate from the bottom and are electrically insulated from the header by glass. The collector region of the transistor device is mechanically and electrically attached to the top of the header plate in heat exchange relationship thereto. A cylindrical can is soldered or hot welded to the top of the header plate to encapsulate the transistor in a dry ambient. The ears formed by the diamond-shaped header which extend from opposite sides of the can are provided with bolt holes for attaching the device to a suitable heat sink or other chassis board.

Many attempts have been made to reduce the cost of power transistors. However, true economy can be measured only in terms of cost per power output. Most attempts to reduce cost have resulted in reduced power. One of the major problems in obtaining a high power output is the dissipation of heat. For this reason, it is customary to fabricate the diamond-shaped header from copper because copper is a very good heat conductor. But copper is relatively expensive and constitutes a major portion of the materials cost of the transistor device. For this reason, the can is usually fabricated from some other metal which is less expensive than copper, but which is a much poorer thermal conductor than copper. Transistors using mild steel headers have been marketed, but the thermal conductivity of the headers is so low that the power rating of the device is materially reduced.

All power transistors having high power ratings presently on the commercial market employ copper headers. However, the high power ratings apply only when the headers are attached securely to a large heat sink in such a manner that the heat generated by the device will be transmitted by the thermally conductive copper to the heat sink and then radiated from a much larger area of the heat sink which may also be provided with radiating fins or the like. Before maximum heat can be transferred from the header to the heat sink, the header must be in intimate contact with the heat sink over a large area. The heat sink may be strong and rigid and therefore may have a very flat surface. However, for various reasons, it is very difficult to obtain a flat surface on the header after the header is bolted to the heat sink. For example, the high temperatures involved in the hot welding or soldering of the can to the transistor frequently warp the flat heat transfer surface of the header. Also, as the header is bolted to the chassis, the mechanical forces tend to distort the flat surface. For this reason it is customary to initially manufacture the header such that the heat transfer face is slightly bowed. Then when the bolts are tightened, the header tends to flatten out and attain a large contact area. However, the two points to which the bolt pressures are applied invariably result in some distortion of the header so that optimum contact area is not achieved. Further, the distortion of the header by the bolts tends to weaken the glass seals between the conductor wires extending through the header, tends to disrupt the connections between the transistor device and the header, and causes severe electrical parameter shifts and occasional catastrophic failures.

Another problem in mass producing transistor devices for commercial markets is that it is necessary to adopt a standard unit which may be operated in various modes so as to attain an economical mass production level. For example, the transistors heretofore used employed the diamond-shaped headers to form the ears for the bolt holes to connect the device to a heat sink. These same devices are used in conjunction with printed circuit boards or other non-heat sink applications at lower power ratings. Nevertheless, the cost of manufacturing the devices is the same even though the ears are no longer required to connect the device to the heat sink.

The present invention contemplates an improved device for encapsulating a power transistor or the like comprising a header member having a heat-transfer portion and a peripheral side wall comprising a radially-extending portion terminating in a cylindrical portion which in turn terminates in a first radially-extending peripheral flange, and a can member having a top wall and peripheral side walls terminating in a second radially-extending peripheral flange which is mated with and cold welded to the first peripheral flange by a peripheral weld seam to form an airtight container for the transistor device. The peripheral side walls of the header are substantially less in thickness than the heat-transfer portion so that forces applied thereto do not induce material distortion stresses in the heat-transfer portion. The heat-transfer portion may then have a precisely flat heat-transfer surface for abutment against a suitable heat sink. A coupling engages only the peripheral flange and is adapted to be connected to a heat sink to press the heat-transfer surface against the heat sink.

In accordance with another important aspect of the invention, the peripheral weld seam is made by compressing the two peripheral flange portions together, substantially at room temperature, by annular dies, one of which is flat and the other of which has a relatively narrow, arcuate cross section to produce a cold weld seam. The low temperatures of the cold weld process greatly reduce the outgassing problem and prevent heat distortion of the flat surface during manufacture.

Another important aspect of this invention entails a header construction which results in a significant saving in the weight of copper used in the device without increasing the thermal resistance. This is accomplished in part by a construction which eliminates the copper ears forming the bolt holes and the use of a pedestal to reduce the thickness of the header. The pedestal also forms a mesa upon which the indium collector of the transistor device can be attached in such a manner as to reduce the thickness of the free indium to a minimum and thereby increase the efficiency of the device. The can member is also preferably fabricated from copper as to facilitate the cold weld and to also obtain good heat transfer throughout the device and increase the heat radiating surface when the device is operated in a free atmosphere.

The invention also contemplates various coupling devices for connecting the airtight container to a heat sink or to a circuit board. In one specific embodiment, a coupling member comprised of a relatively thin plate is provided with an aperture for receiving the can and with a pair of bolt holes disposed on opposite sides of the aperture. A peripheral depending stiffening flange portion extends around the periphery of the plate and similar stiffening flange portions around each of the bolt holes for sleeves for receiving bolts. The coupling member is placed in intimate contact with the can member and is preferably fabricated from aluminum so as to provide a good heat conducting and radiating fin.

The invention also contemplates means for modifying the encapsulation device in such a manner that it can be connected in a standard printed board circuit. This is accomplished by inserting and securing pin members in the sleeves formed by the stiffening flanges around the respective bolt holes.

Another important aspect of the novel device is that it can be used without the coupling member in a thermally free state merely by connecting a suitable lead to the container, preferably to one of the flanges by cold welding, such that the device can be connected to a printed circuit or the like. This materially reduces the cost of the device because of the reduction of material.

Therefore, an important object of the present invention is to provide an improved power transistor device.

Another important object of the present invention is to provide an improved encapsulation device for various semiconductor devices.

Another object of this invention is to provide a power transistor which can be very economically manufactured yet which has a high power rating.

Still another object of the invention is to provide an economical encapsulation device which can be standardized in size and construction, yet which can be economically adapted to be connected to a heat sink, a printed circuit board or other application.

Still another object of this invention is to provide an encapsulation device having a large surface area which can be placed in efficient heat transfer relationship with a heat sink.

Yet another object of the invention is to provide an improved method for manufacturing an encapsulation device of the type described which does not require high weld temperatures which otherwise would tend to cause excessive outgassing and poisoning of the ambient and would tend to warp the header and adversely affect seals and electrical connections of the device.

Many objects and advantages will be evident to those skilled in the art from the following detailed description and drawings, wherein.

Figure 1:
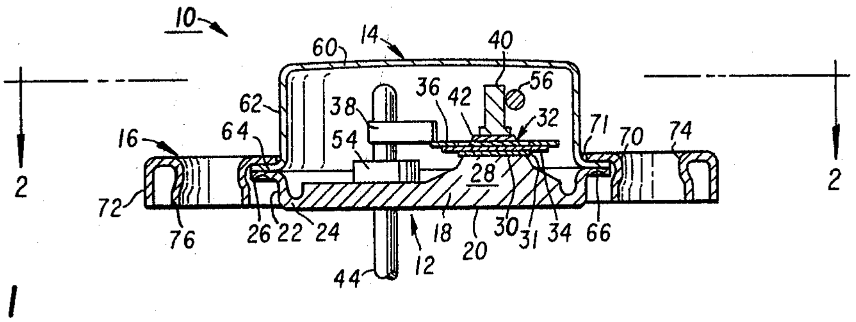
FIGURE 1 is a sectional view of a power transistor device constructed in accordance with the present invention.

Referring now to the drawings, a power transistor device constructed in accordance with the present invention is indicated generally by the reference numeral 10. The device 10 is comprised of a header member, indicated generally by the reference numeral 12, a can member, indicated generally by the reference numeral 14, and a coupling member, indicated generally by the reference numeral 16.

The header member 12 is comprised of a disc-shaped heat-transfer portion 18 having a flat heat exchange surface 20 for engaging a suitable heat sink as will hereafter be described in greater detail. The header member 12 has a peripheral side wall portion 22 which is joined to the heat-transfer portion 18 by a first radially-extending peripheral flange portion 24. The peripheral side wall 22 terminates in a second radially-extending, peripheral flange portion 26 which is disposed generally in a plane parallel to the plane of the heat exchange surface 20. The peripheral flange 26 may be considered as having upper and lower faces when oriented as illustrated in FIGURE 1. It will be noted that the side wall portion 22, including the radial flange portions 24 and 26, is substantially thinner than the heat-transfer portion 18. This construction tends to isolate mechanical stresses which may be applied to the flange 26 from the heat-transfer portion 18 as will presently be described.

The header portion 12 also has a double frustoconical pedestal portion 28 which forms a mesa 30 having a diameter slightly less than that of the indium collector region of a conventional alloy transistor indicated generally by the reference numeral 32. The alloy transistor 32 also has a wafer 34 and a base ring 36 having a lead tab 38. A stud 40 is connected to the emitter region 42 of the transistor 32 to complete the transistor construction.

Figure 2:
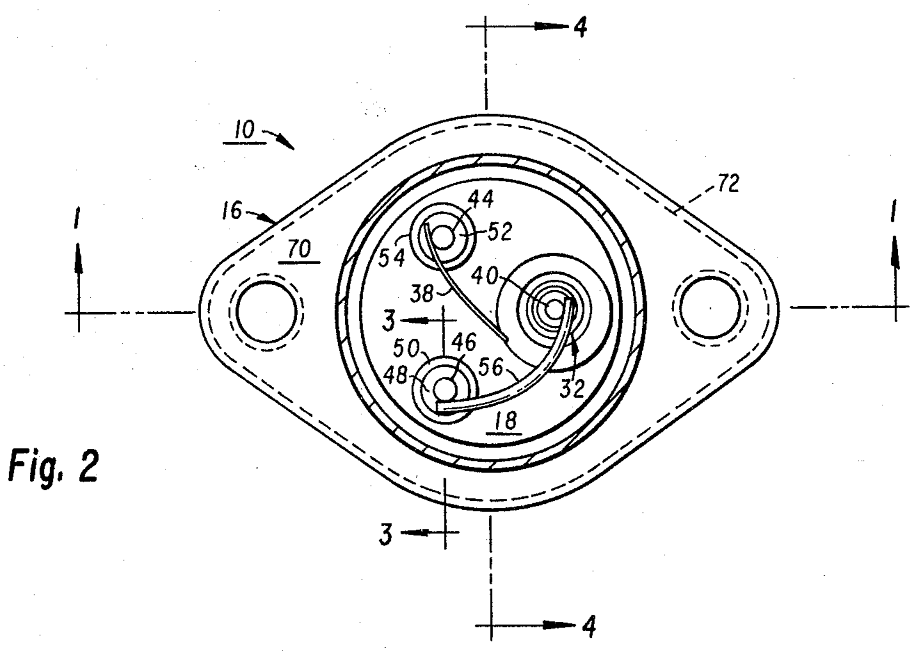
FIGURE 2 is a sectional view taken substantially on lines 2—2 of FIGURE 1.
Figure 3:
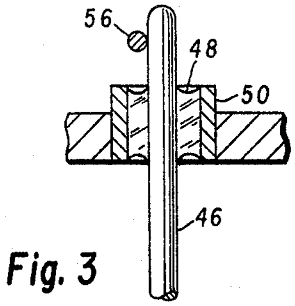
FIGURE 3 is a sectional view taken substantially on lines 3—3 of FIGURE 2.
Figure 4:
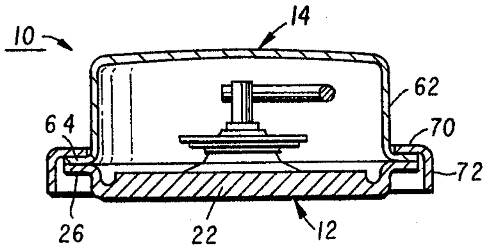
FIGURE 4 is a partial sectional view taken substantially on lines 4—4 of FIGURE 2.

A pair of wire leads 44 and 46 pass through suitable apertures in the heat-transfer portion 18 in the manner best illustrated in FIGURE 3 and are positioned relative to the pedestal 28 as can best be seen in FIGURE 2. For example, the lead 46 passes through a glass bead 48 which is contained within a metallic sleeve 50. The metallic sleeve 50 is soldered in an aperture in the heat-transfer portion 18 by conventional techniques. The lead 44 similarly passes through a glass insulation bead 52 disposed within a metallic sleeve 54 which is soldered in another aperture in the heat-transfer portion 18. The lead tab 38 is connected to the wire lead 44 and a conductor 56 connects the stud 40 to the wire lead 46. Thus it will be noted that the collector region of the transistor 32 is connected through the pedestal 28 to the header 12, the base is connected through the ring 36 and lead tab 38 to the wire lead 44, and the emitter is connected through the stud 40, the conductor 56 and the wire lead 46.

The can 14 is comprised of a top wall 60, a peripheral side wall 62 and a radially-extending, peripheral flange portion 64. The lower surface of the flange portion 64 mates with the upper surface of the flange portion 26 on the header member 12. The two flange portions 64 and 26 are fused together by a peripheral weld seam formed by compressing the two flange portions between an annular upper die having a wide contact surface substantially equal to the width of the flange portion 64 and a lower die having a curved contact portion having a radius substantially as indicated by the radius of the peripherally-extending groove 66 in the lower face of the flange portion 26. The diameter of the side wall 62 is preferably less than the diameter of the side wall 22 so that a clamping force will be transmitted to the wall 22 as will hereafter be described.

The coupling member 16 is comprised of a plate 70 which has an aperture 71 for receiving the side wall 62 of the can member 14. The plate 70 is disposed generally parallel to the heat exchange surface 20 of the header 12. A stiffening flange portion 72 extends around the periphery of the plate as illustrated in dotted outline in FIGURE 2. A pair of bolt holes 74 are disposed on opposite sides of the aperture 71 and a pair of depending stiffening flange portions 76 are disposed around each of the bolt holes and form generally cylindrical sleeves. The bolt holes 74 are positioned such that the stiffening flange portions 76 are disposed in close proximity to the edges of the peripheral flange portions 64 and 26 of the header 12 and can 14, respectively. The stiffening flange portions 76 are flared somewhat as illustrated in FIGURE 1 so as to engage the flange portions 64 and 26 and secure the coupling member 16 in position around the peripheral side walls 62 of the can 14. The edge of plate 70 around the aperture 71 preferably abuts the peripheral side walls 62 so as to cover substantially all of the upper face of the flange portion 64 and transmit a force to the flanges 64 and 26 and the side wall 22 as will presently be described. It is desirable for the coupling member 16 to be in intimate contact with the can member 14 over as much area as possible so as to increase the heat transfer rate therebetween. For this reason, as well as to secure the coupling member 16 in place, the plate 70 may be press fitted around the side wall 62. The stiffening flange 72 may be press fitted around the flanges 26 and 64, or the flanges 26 and 64 may be compressed and expanded into engagement with the peripheral flange 72, and the lower edge of the flange 72 may be crimped inwardly.

Figure 5:
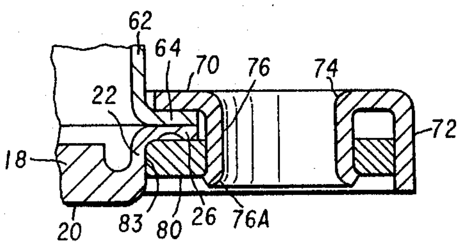
FIGURE 5 is a partial sectional view taken on the same plane as FIGURE 1 showing an alternate embodiment of the present invention.

If desired, the coupling means for the device 10 may include the coupling member 16 and an additional lower plate 80 as illustrated in FIGURE 5 which is sized to be closely received within the confines of the peripheral stiffening flange 72. An aperture 82 in the lower plate 80 receives the peripheral side walls 22 of the header 12. A pair of bolt hole apertures receives the sleeves formed by stiffening flange portions 76. In this case the lower ends of the flange portions 76 would not be flared as illustrated in FIGURE 1. Instead, the lower ends 76*a* of the stiffening flanges 76 around the bolt holes 74 may be crimped to form an eyelet and secure the lower plate 80 in position. If desired, the stiffening flange 72 may also be crimped to secure the lower plate, but this is usually unnecessary. This construction provides a stiff and neat coupling member for the encapsulation container formed by the header 12 and can 14.

Figure 6:
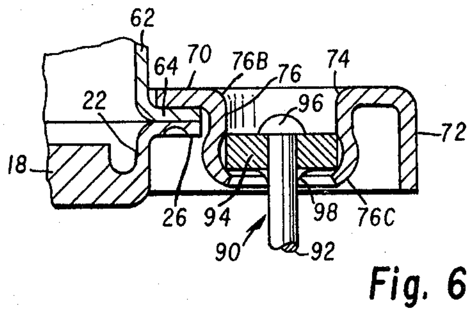
FIGURE 6 is a partial sectional view similar to FIGURE 5 showing still another embodiment of the present invention; and, FIGURE 7 is a partial sectional view similar to FIGURE 5 showing still another embodiment of the present invention.

The coupling means described in FIGURES 1 and 5 are used for connecting the device 10 to the heat sink of an electrical chassis by means of a pair of bolts as will presently be described. For some applications, particularly for use in connection with printed circuits, the bolts are not required, but it is necessary to make electrical connection with the collector of the transistor through the header 12, can 14 and coupling member 16. This can be economically accomplished by securing a pin member 90 within each of the stiffening flange portions 76 around each of the bolt holes 74 substantially as illustrated in FIGURE 6. Each of the pin members 90 is comprised of a conductor pin 92 which is secured in an electrically-conductive disc member 94 by a suitable head 96 and enlarged shank 98. The disc member 94 is secured in place by swedging the upper and lower portions 76*b* and bottom 76*c* of the stiffening flanges 76 substantially as illustrated. This can be accomplished by applying a longitudinal force to the opposite ends of the sleeves so as to cause swelling of the central portion around the disc member 94 and swedging of the upper and lower ends. The conductor pins 92 can be passed through apertures in a printed circuit board and soldered in the printed circuit by conventional techniques to both mechanically connect the device 10 to the circuit board and also provide an electrical connection with the collector junction of the transistor 32.

Figure 7:
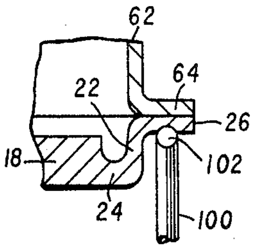

Still another important aspect of the invention is illustrated in FIGURE 7 wherein the airtight container formed by the header member 12 and can member 14 may be connected in a printed circuit or the like without use of a coupling means such as the member 16. This can be accomplished by simply cold welding a small segment 102 of a conductor wire 100 to the flange portion 22. As illustrated, the segment 102 is disposed normal to the main conductor wire 100 and is received in the groove 66 formed by cold welding the peripheral flanges 26 and 64. This provides three leads from the transistor device, including the base and emitter leads 44 and 46, which may be soldered or otherwise connected in a printed circuit or the like. The device 10 would then be considered as operating in free air and heat would be dissipated as will presently be described.

An important aspect of the present invention is the economy with which the encapsulation device 10 may be constructed. The header 12 and can 14 may be formed by any suitable technique such as impact molding, stamping or the like. The wire leads 44 and 46 are secured within the glass insulating masses 48 and 52 and cylindrical sleeves 50 and 54 using conventional techniques. The various components of the alloy transistor 32 are also fabricated using conventional techniques. Then the wire lead assemblies are positioned in the appropriate apertures in the heat-transfer portion 18, the components of the transistor 32 oriented on the mesa 30 formed by the pedestal 28, and the header member fired in the conventional manner to solder the sleeves 50 and 54 in position and alloy the transistor 32 to the mesa 30.

The pedestal portion 28 performs a very important function in that the area of the mesa 30 is slightly less than the total area of the indium collector region of the transistor 32. As the device is fired, the excess indium melts and runs down the frustoconical sides of the pedestal 28 away from the junction between the pedestal and alloyed collector region so as to increase the efficiency of the transistor 32. The lead tab 38 and conductor wire 56 may be connected to the ends of the leads 44 and 46, respectively, by conventional techniques.

Next the can 14 is welded to the header 12 to encapsulate the transistor 32 in a dry ambient. This is easily accomplished at room temperature by mating the flange 64 with the flange 26, applying a relatively wide circular die having a width corresponding essentially to the width of the peripheral flange 64 to the upper surface of the flange 64, and then applying a circular die having a circular cross section substantially as indicated by the groove 66 to the lower face of the peripheral flange 26. As the two dies are moved together with great force, the material of the two flanges actually fuses together even though no external heat is applied to produce a peripheral weld seam. Devices constructed by the cold weld are considered to be helium-tight or substantially hermetically sealed such that the device is of the highest quality. However merely making the weld seam airtight is sufficient for some purposes. Another important aspect of the invention is that both the header member 12 and can member 14 are fabricated from copper so as to facilitate the cold weld as well as to facilitate heat dissipation. The copper members are preferably nickel-plated to clean and stabilize the surface, and by using the proper nickel alloy also facilitate the cold weld technique. The cold weld is substantially less expensive than hot welding techniques heretofore used. The low temperatures of the cold weld do not warp any portions of the header 12 or can 14 which would tend to disrupt the contour of the flat heat-transfer surface 20 which is so essential to efficient heat dissipation as will presently be described, or which would tend to disrupt the glass and solder seals between the conductors 44 and 46 or weaken any electrical connections as would otherwise be the case.

The coupling member 16 can easily and economically be stamped from relatively thin sheet aluminum to produce the completed shape illustrated. The coupling member 16 can then be snapped in place around the can 14 and retained by the flared portions of the stiffening flanges 76. Or if desired, the apertures 71 can be press fitted around the peripheral side wall 62 of the can member 14 to insure good mechanical and heat transfer coupling. If desired, the flanges 26 and 64 may also be pressed and expanded to engage the peripheral flange 72 of the coupling member 16 to increase the contact area for heat exchange purposes. Of course the aluminum is a very good heat conductor and serves as a radiating fin. The coupling member 16 increases the heat radiating surface of the device 10 by about twenty percent.

Another important aspect of this invention is the saving in material costs effected by the reduction in the amount of copper used in the device 10. Elimination of the ears on the standard header results in a substantial saving. In addition to forming the mesa 30 necessary to obtain good contact with the collector zone of the transistor 32, the pedestal also provides the minimum direct path for heat to radiate to the heat exchange surface 20 and materially reduces the thickness of the heat-transfer portion 18.

As previously mentioned, the surface 20 must be very flat after the device is bolted to a heat sink in order to have efficient heat transfer to the heat sink. The heat-transfer portion 18 need only be sufficiently thick to provide strength for maintaining the surface 20 flat. Since the header member and can member are cold welded at room temperature, no uneven heat is ever applied to the heat-transfer portion 18 which would tend to warp the surface 20. Thus the flat surface 20 is accurately maintained from the moment the header member 12 is first formed until after construction of the airtight container formed by the header 12 and the can 14 is completed. Further, the low temperature of the cold weld technique permits a lower temperature to be used to solder the lead wire assemblies in the header and alloy the transistor in place.

It is essential that the flat heat exchange surface 20 be clamped firmly against the heat sink and not distorted by the force so as to obtain a maximum intimate contact area for heat exchange purposes. This is accomplished by passing bolts through the bolt holes 74 and connecting the bolts to the heat sink. As the bolts are tightened, the coupling member 16 exerts a force on the flange 64 normal to the heat exchange surface 20 to securely press the surface 20 against the heat sink. In this respect, an important aspect of the invention is that the peripheral side wall portion 22, and in particular the radial flange portion 24 which joins the side wall portion to the heat-transfer portion 18, is substantially thinner than the heat-transfer portion 18. The thickness and shape of the side wall isolates the heat-transfer fortion 18 from any force exerted in such a manner that no appreciable flexure force will be transmitted which would otherwise warp the flat surface 20. It will also be noted that the plate 70 of the coupling member 16 extends over the peripheral side wall 22 of the header 12 so that a considerable portion of the force will be directly applied to the peripheral wall 22 rather than to the flange 26. This tends to reduce the likelihood that the relatively thin metal of the flanges 26 and 64 will creep after the device has been bolted to the heat sink a considerable length of time and reduce the pressure holding the surface 20 against the heat sink.

When the power transistor device is to be used in free air, that is when it is not to be bolted against a heat sink, the device also has a far superior heat dissipation capability and therefore a greater power rating than the power transistors heretofore on the market. This increased heat dissipation is due in part to the fact that both the header 12 and the can 14 are copper and are therefore good heat conductors and radiators. Therefore the heat is efficiently conducted from the pedestal 28 through the heat-transfer portion 18, through the peripheral side wall 22, and through the peripheral cold weld seam to the can 14. The total surface area of the header member 12 and can member 14 is considerably larger than the effective radiating surface of devices heretofore available. Further, when the clamp member 16 is properly fitted around the can member 14 as previously described so as to obtain maximum intimate contact area for maximum heat exchange, the entire aluminum coupling member 16 serves as an additional thermal radiation fin.

Another important aspect of the invention is that the basic encapsulation component comprised of the header member 12 and can member 14 may be standardized in size and construction and still be used in a wide variety of situations. For example, the coupling member 16 is so sized that the position of the bolt holes 74 and the leads 44 and 46 will fit heat sinks having standard holes for present power transistors. If desired, the construction illustrated in FIGURE 5 can be employed to more securely connect the coupling member 16 to the header member 12 and can member 14 and to provide additional stiffness and strength as well as a cleaner appearance. The device 10 can very easily be adapted for connection in a printed circuit board by insertion of the pin members 90 in the sleeves formed by the stiffening flanges 76 substantially as illustrated in FIGURE 6. Then the conductor pins 92 and the conductor wires 44 may be passed through apertures in the circuit board and the ends soldered to the printed circuit in the conventional manner. The device is then operated under free power rating which is unusually high due to the increased surface and for heat radiation. In the event it is desired to connect the device 10 in a circuit not employing standard holes, the construction illustrated in FIGURE 7 may be utilized to provide a collector connection in the circuit. In such an event, only three apertures would be provided in the circuit board and the leads 44, 46 and 100 passed through apertures or otherwise mechanically secured to the chassis and electrically connected in the circuit. It will be appreciated that any suitable means for making electrical contact with the header member 12 or can member 14 may be employed to make electrical contact with the collector of the transistor 32. Due to the reduced quantity of copper used in the header member 12 and can member 14, and the relatively thin lightweight aluminum coupling member 16, the device 10 is much lighter in weight than transistors presently on the market and having equal power rating. Therefore the device 10 can be advantageously used in aircraft and space applications.

The transistor device can be manufactured at approximately one-half the labor and material cost of standard power transistors presently on the market and with increased performance in most cases. Devices constructed in accordance with the invention have been rated at 150 watts as compared with 70 watt ratings of some similar transistors presently on the market. The transistors constructed in accordance with the invention have handled from three to five times as much current as transistors presently on the market. Further, ratio between the power ratings of the device 10 and equivalent devices presently on the market increases in favor of the novel device when operated in the free air due primarily to the increased area of radiating surface.

Although the header is illustrated as the bottom member, or member designed to abut the heat sink, it will be appreciated by those skilled in the art that, with only slight dimensional modifications, the container formed by the header member and can member could be inverted. The can member would then be pressed against the heat sink and the leads from the header would extend upwardly for connection in a circuit. In this case, a suitable coupling member could be employed to engage the peripheral flange of the header or the header itself to secure the device against the heat sink or other support.

Although several embodiments of the present invention have been described in detail, it is to be understood that various changes, substitutions and alterations can be made therein without departing from the spirit and scope of the invention as defined by the appended claims.

What is claimed is:

1. An improved encapsulating device for a power transistor or similar device comprising:

an airtight container having a flat heat-exchange surface and a peripheral flange disposed generally in a plane parallel to and offset from the heat-exchange surface, and a clamp member comprised of a first plate having an aperture for receiving the airtight container disposed to engage one side of the peripheral flange, a second plate having an aperture for receiving the airtight container disposed to engage the other side of the peripheral flange, flange means on one of the plates, the flange means being crimped around the other plate to secure the clamp member on the container, and bolt hole means in the clamp member on opposite sides of the container, whereby bolts may be passed through the bolt holes and connected to a chassis heat sink and tightened to press the heat-exchange surface against the heat sink.

2. An improved power transistor comprising:

a header member comprised of a disc-shaped heat sink portion having a flat bottom and a mesa formed on the upper surface, an annular flange portion having a radially-extending portion terminating in a cylindrical side wall portion in turn terminating in a second radially-extending flange portion having a lower surface disposed above the flat bottom of the heat sink portion and an annular upper surface disposed generally in a plane, a pair of insulated electrical leads extending through the heat sink portion, a transistor mechanically and electrically connected to the mesa in heat-transfer relationship thereto, and electrically connected to each of the leads, a can member having a top wall, a peripheral side wall, and an annular, radially-extending flange portion having upper and lower surfaces, the lower surface mating with and being in peripheral contact with the upper surface of the second radially-extending portion of the header member annular flange portion and being cold welded thereto, a clamp member comprised of a sheet metal portion having an aperture for receiving the peripheral side wall of the can member and engaging the upper surface of the radially-extending flange portion of the can member for exerting a downward force thereon, a depending peripheral stiffening flange around the periphery of the sheet metal portion, and bolt holes disposed on opposite sides of can member, and depending stiffening flanges around the bolt holes, and a plate member disposed below the second radially-extending flange portion and having an aperture receiving the cylindrical side walls of the header member, apertures for receiving the depending stiffening flanges around the bolt holes, and being disposed within the depending peripheral stiffening flange, and wherein a portion of at least one of the stiffening flanges is crimped to retain the plate member in place.

References Cited by the Examiner

UNITED STATES PATENTS

| | | | |
|---|---|---|---|
| 2,896,136 | 7/1959 | Hales | 317—234 |
| 2,932,684 | 4/1960 | Hales et al. | 174—52 X |
| 3,024,519 | 3/1962 | Leinkram et al. | 312—234 X |

LARAMIE E. ASKIN, *Primary Examiner.*

JOHN F. BURNS, ROBERT K. SCHAEFER, *Examiners.*

J. F. RUGGIERO, *Assistant Examiner.*